(12) United States Patent
Phan et al.

(10) Patent No.: US 6,275,080 B1
(45) Date of Patent: Aug. 14, 2001

(54) ENHANCED SINGLE EVENT UPSET IMMUNE LATCH CIRCUIT

(75) Inventors: Ho G. Phan, Centreville, VA (US); Derwin L. Jallice, Austin, TX (US); Bin Li, Fairfax, VA (US)

(73) Assignee: BAE Systems, Manassas, VA (US)

( * ) Notice: Subject to any disclaimer, the term of this patent is extended or adjusted under 35 U.S.C. 154(b) by 0 days.

(21) Appl. No.: 09/480,454

(22) Filed: Jan. 11, 2000

Related U.S. Application Data
(60) Provisional application No. 60/145,939, filed on Jul. 28, 1999.

(51) Int. Cl.[7] .................................................. H03K 3/037
(52) U.S. Cl. ........................... 327/200; 327/201; 327/210
(58) Field of Search .................................... 327/199, 200, 327/201, 202, 203, 208–211, 218

(56) References Cited

U.S. PATENT DOCUMENTS

| | | | |
|---|---|---|---|
| 4,638,463 | 1/1987 | Rockett, Jr. | 365/205 |
| 4,809,226 | 2/1989 | Ochoa, Jr. | 365/156 |
| 4,956,815 | * 9/1990 | Houston | 365/154 |
| 5,053,848 | 10/1991 | Houston et al. | 357/51 |
| 5,111,429 | 5/1992 | Whitaker | 365/156 |
| 5,134,312 | 7/1992 | Jones, Jr. et al. | 327/223 |
| 5,135,882 | 8/1992 | Karniewicz | 437/52 |
| 5,175,605 | 12/1992 | Pavlu et al. | 257/369 |
| 5,301,146 | 4/1994 | Hama | 365/154 |
| 5,307,142 | * 4/1994 | Corbett et al. | 365/156 |
| 5,311,070 | 5/1994 | Dooley | 327/200 |
| 5,396,169 | * 3/1995 | Buehler et al. | 324/158.1 |
| 5,406,513 | 4/1995 | Canaris et al. | 365/181 |
| 5,418,473 | 5/1995 | Canaris | 326/27 |
| 5,504,703 | 4/1996 | Bansal | 365/156 |
| 5,523,966 | 6/1996 | Idei et al. | 365/156 |
| 5,525,923 | 6/1996 | Bialas, Jr. et al. | 327/210 |
| 5,559,461 | 9/1996 | Yamashina et al. | 327/205 |
| 5,631,863 | 5/1997 | Fechner et al. | 365/156 |
| 5,640,341 | 6/1997 | Bessot et al. | 365/156 |
| 5,764,089 | 6/1998 | Partovi et al. | 327/200 |
| 5,870,332 | 2/1999 | Lahey et al. | 365/156 |
| 5,905,290 | * 5/1999 | Houston | 257/380 |

FOREIGN PATENT DOCUMENTS

| | | |
|---|---|---|
| 0335008 A1 | 10/1989 | (EP) . |
| 0 357 980 A2 | 3/1990 | (EP) . |
| 0357982 A2 | 3/1990 | (EP) . |
| 0 432 846 A1 | 6/1991 | (EP) . |

OTHER PUBLICATIONS

"On–Chip Receiver Featuring Fall–Through Radiation–Hardened Latching", IBM Technical Disclosure Bulletin, vol. 32, No. 12, May 1990 ,pp. 389–392.

K. Joe Hass et al., "Mitigating Single Event Upsets From Combinational Logic", 7th NASA Symposium on VLSI Design 1998, pp. 4.1.1–4.1.10.

Dr. David G. Mavis et al., "Temporally Redundant Latch For Preventing Single Event Disruptions In Sequential Integrated Circuits", Technical Report P8111.29 published by Mission Research Corporation on Sep. 8, 1998, Revised on Oct. 8, 1998, pp. 1–40.

* cited by examiner

*Primary Examiner*—Tuan T. Lam
(74) *Attorney, Agent, or Firm*—Venable; Ralph P. Albrecht

(57) ABSTRACT

An enhanced single event upset immune CMOS latch circuit is formed of a first and a second cross-coupled invertor having isolation transistors in the path coupling the drains of the transistors in the first invertor.

22 Claims, 6 Drawing Sheets

CLK
node 220

DATA
node 202

Q*
node 248 node 250

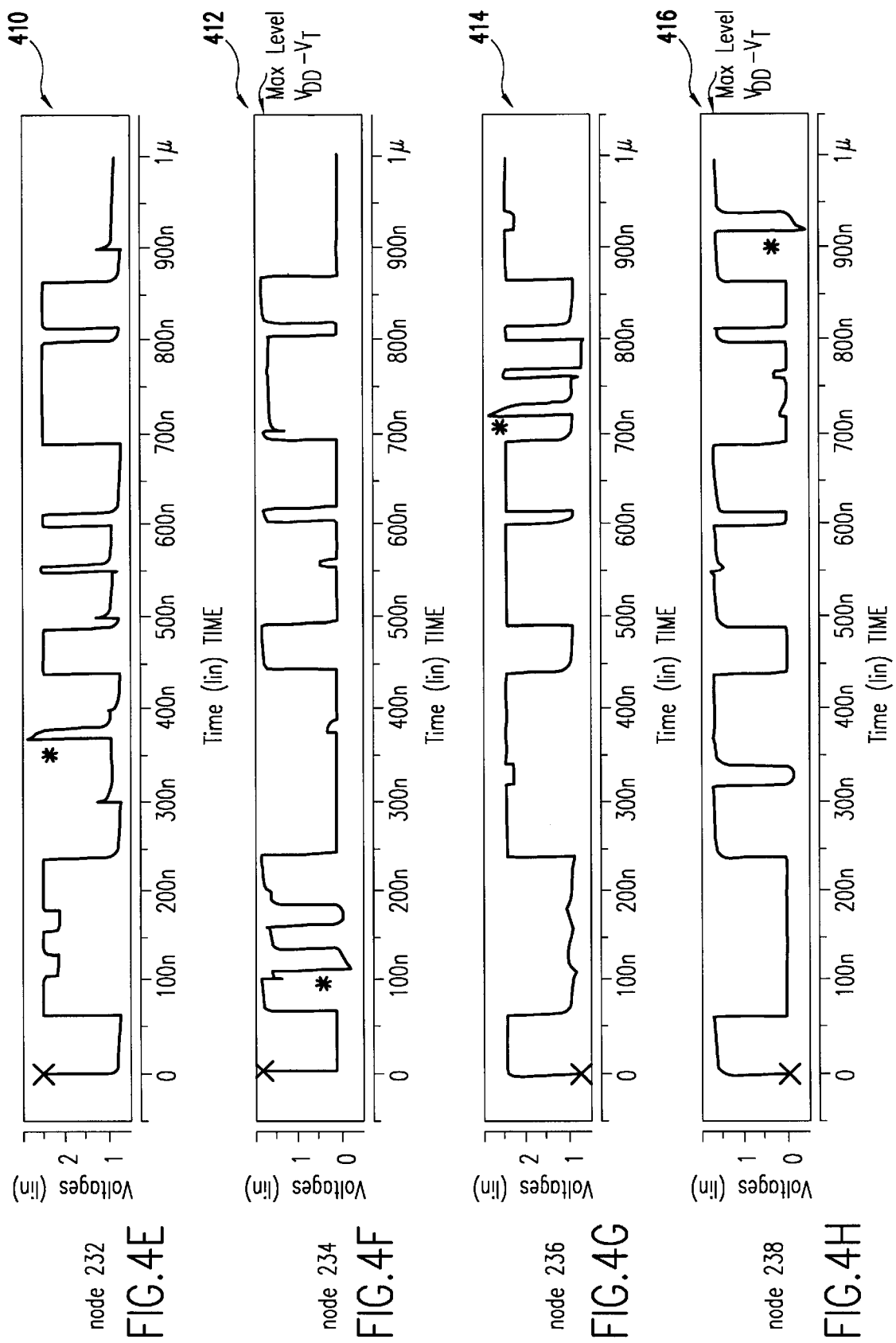

ENHANCED SINGLE EVENT UPSET IMMUNE LATCH CIRCUIT

RELATED APPLICATION

This is a non-provisional application related to U.S. Provisional patent application Ser. No. 60/145,939, filed Jul. 28, 1999.

FIELD OF THE INVENTION

The present invention relates to a CMOS latch circuit having enhanced single event upset (SEU) radiation immunity, and more particularly to a SEU enhanced latch circuit element which can be conveniently manufactured using commercially available technology.

BACKGROUND OF THE INVENTION

As will be appreciated by those skilled in the art, semiconductor data storage circuits struck by high energy particles in a space environment can lose data due to the ionizing effects of the impact. The data storage circuits can include latches which can be used as registers in a processor or as a storage cell in a memory. These latches are susceptible to the energized particle strikes. The processors including the latches can be used in satellites and in other computer equipment which can be placed in environments which are highly susceptible to radiation. A processor in a satellite in a space environment, can be exposed to a radiation-induced soft error or single event upset (SEU) when a node of the latch is struck by high energy particles. A soft error or SEU typically is caused by electron-hole pairs created by, and along the path of, a single energetic particle as it passes through an integrated circuit. Should the energetic particle generate the critical charge in the critical volume of a latch, then the logic state of a node of the latch and thus, the contents of a register can be upset. This critical charge, by definition, is the minimum amount of electrical charge required to change the logic state of the register. The critical charge may also enter the latch through direct ionization from cosmic rays.

SEU typically results from alpha particles (helium nuclei), beta particles or gamma rays impacting a low-capacitance node of a semiconductor circuit. An example of an SEU of an inverter is illustratively described. An inverter can include a PMOS transistor and an NMOS transistor with their drains coupled together. The inverter can be used to generate complementary signals. When an alpha particle strikes bulk semiconductor material in the PMOS transistor, it can generate electron-hole pairs. Assuming that the NMOS transistor is on and that the PMOS transistor is off, the holes which collect at the coupled drain can change the voltage at an output node coupled to the drains from a logic low to a logic high. Electrons will diffuse toward the circuit supply voltage through the PMOS. A charge generating energetic particle hit on the NMOS transistor has the opposite effect, with positive charges drifting towards ground and negative charges collecting at the drain output, thus possibly changing the logic state of the inverter with its NMOS transistor off and its PMOS transistor on. In P-substrate, bulk CMOS technologies with PMOS devices formed in an NWELL, the effect of a charge particle hitting an NMOS transistor diffusion is typically worse than when a charged particle hits a PMOS transistor diffusion in an NWELL.

As will be appreciated by those skilled in the art, when a heavy ion traverses a node within a latch, the ion can force the node from its original state to an opposite state for a period of time. This change of state can be due to the charge that the heavy ion deposits as it passes through the silicon of a MOS transistor of the latch. If this node is held in the opposite state for a period of time longer than the delay around a feedback loop of the memory cell, the cell can switch states and the stored data can be lost. The period of time which the node is held in its opposite state can depend on several factors including, the charge deposited, the conductance of the transistors of the latch and the delay around the feedback loop of the latch.

Conventional designs that add resistive coupling between stages of a latch or bi-stable CMOS circuit have been used to provide hardening (i.e. immunity) against these so called single event upset (SEU) phenomena. The interstage resistive coupling can be effective in providing hardening against upsets from high energy particles, but this approach increases the time to write data into the element.

Resistive coupling can be used to radiation harden a CMOS static random access memory (RAM) cell; see for example U.S. Pat. No. 5,053,848, the contents of which are incorporated herein by reference in their entirety. The RAM cell includes lightly doped polysilicon resistors forming feedback paths between two CMOS invertors.

Metal oxide semiconductor (MOS) originally described transistor gates which were fabricated using metal over a thin oxide layer. A MOS transistor can also be commonly referred to as a field effect transistor (FET) or as a MOSFET. Today the term is applied more broadly to include transistors with gates of polysilicon over oxide. NMOS, PMOS and CMOS are three exemplary types of MOS technology. "NMOS" refers to n-type MOS transistors. "N-type" refers to a dopant introduced into silicon to enhance its ability to conduct electrons, which are negatively charged particles. "PMOS" uses a p-type dopant which enhances the conduction of electron "holes," which are positive charges. "CMOS" means complementary MOS and involves the fabrication of both PMOS and NMOS devices on a single substrate. Usually, PMOS devices are fabricated in n-type wells while NMOS devices are formed within primarily p-type substrate. NMOS has long prevailed over PMOS as a technology of choice, while CMOS has advanced rapidly as advantages of combining PMOS and NMOS have often outweighed the complexity of combining them. A PMOS can also be referred to as a PFET and an NMOS as an NFET.

FIG. 1 illustrates a conventional unhardened register element 100, typically used in commercial designs. CMOS transistors, including PFET 104 and NFET 106 having source-drain regions coupled together, and PFET 116 and NFET 118 also having source-drain regions coupled together, are used to access data storage invertor 124 including PFET 108 and NFET 110, and data storage inverter 126 including PFET 112 and NFET 114, and to provide regeneration feedback loop 128. When signals CLK 120 and CLK* 122 are active, write access to the data storage element is provided through an input D 102 and CMOS transmission gate including transistors PFET 104 and NFET 106. With CLK 120 and CLK* 122 active, the feedback transistors, PFET 116 and NFET 118 are turned off, allowing the D input 102 to force node 132, 136 and 138 to proper logic levels. When CLK 120 and CLK* 122 are inactive, access through PFET 104 and NFET 106 ceases, and the regenerative feedback 128 from node 134 to node 132 is completed by the CMOS transmission gate including transistors PFET 116 and NFET 118. An approach which can be used to radiation harden a circuit can include an isolation circuit. One isolation circuit is described in U.S. Pat. No. 5,525,923, issued to Bialas, Jr., et al., of common assignee the present invention, the contents of which are incorporated herein by reference in their entirety. The Bialas et al. patent describes an exemplary isolation circuit including a plurality of resistors which are used to induce resistive delay.

Other techniques for providing SEU immunity, which do not rely on resistive induced delay for hardening, can also be used. These techniques can provide a high level of SEU immunity without adversely affecting the write setup time as can resistive hardening. However, these other techniques can increase transistor count, circuit complexity, and require more silicon area.

While the use of resistor elements to enhance SEU immunity of a latch is known, commercial technology does not readily provide for a resistor forming process. Using polysilicon resistor material which has a high temperature co-efficient of resistance creates processing problems for circuit operation over a wide range of temperatures. In other applications such as gate arrays, a personalization step requiring the formation of polysilicon resistors is not practical. What is needed is a radiation hardened latch that eliminates write time performance penalties, is process insensitive and tracks transistor performance with temperature, and can be fabricated in high density.

SUMMARY OF THE INVENTION

The above-mentioned deficiencies of conventional memory devices and other challenges are addressed by the present invention and will be understood by careful review of the following specification. A single event upset (SEU) immune latch is described including a first PMOS transistor and a first NMOS transistor coupled together at a first drain-source region of the first PMOS transistor and a first drain-source region of the first NMOS transistor, a first PMOS isolation transistor and a first NMOS isolation transistor coupled together at first source-drain regions of the first PMOS isolation transistor and the first NMOS isolation transistor, and coupled at a second drain-source region of the first PMOS isolation transistor to a second drain-source region of the first PMOS transistor and at a second drain-source region of the first NMOS isolation transistor to a second drain-source region of the first NMOS transistor, wherein a gate of the first PMOS isolation transistor is coupled to ground and a gate of the first NMOS isolation transistor is coupled to $V_{DD}$, a second PMOS transistor coupled at a gate to the second drain-source region of the first PMOS and to the second drain-source region of the first isolation PMOS, wherein the second PMOS transistor is coupled at a first drain-source region to $V_{DD}$, a second NMOS transistor coupled at a gate to the second drain-source region of the first NMOS and to the second drain-source region of the first isolation NMOS, wherein the second NMOS transistor is coupled at a first drain-source region to GND, a second PMOS isolation transistor and a second NMOS isolation transistor coupled together at first source-drain regions of the second PMOS isolation transistor and the second NMOS isolation transistor, and coupled at a second drain-source region of the second PMOS isolation transistor to a second drain-source region of the second PMOS transistor and at a second drain-source region of the first NMOS isolation transistor to a second drain-source region of the second NMOS transistor, wherein a gate of the second PMOS isolation transistor is coupled to ground and a gate of the second NMOS isolation transistor is coupled to $V_{DD}$, a feedback PMOS transistor coupled at a first drain-source region to the second drain-source region of the first PMOS transistor, a feedback NMOS transistor coupled at a first drain-source region to the second drain-source region of the first NMOS transistor, a third PMOS transistor coupled at a first drain-source region to a second drain-source region of the feedback PMOS transistor, and at a gate to the second drain-source region of the second PMOS isolation transistor, and at a second drain-source region to $V_{DD}$, a third NMOS transistor coupled at a first drain-source region to a second drain-source region of the feedback NMOS transistor, and at a gate to the second drain-source region of the second NMOS isolation transistor, and at a second drain-source region to GND, a data input that is coupled to the first drain-source region of the first PMOS transistor and the first drain-source region of the first NMOS transistor, a clock coupled to a gate of the first NMOS transistor and a gate of the feedback PMOS transistor, and a complementary clock of the clock coupled to a gate of the first PMOS transistor and a gate of the feedback, NMOS transistor. Several nodes can be struck by an ionizing charged particle resulting in an SEU. The two PFET isolation transistors can temporarily isolate nodes so as to provide enhanced SEU immunity.

The latch of the present invention differs from conventional latches. The present invention, among other advantages, eliminates the need for several delay inducing resistors. Eliminating these resistors provides various advantages. One advantage of the present invention is that the latch no longer needs to be created out of a high impedance material.

An advantage of the present invention is that it provides enhanced SEU immunity for a CMOS latch circuit of high density without additional processing steps.

Another advantage is that it provides an SEU immune latch circuit having no write time setup penalty.

Still another advantage is that it provides an SEU latch circuit whose performance tracks over a wide range of operating temperatures.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digits in the corresponding reference number.

BRIEF DESCRIPTION OF THE DRAWINGS

The foregoing and other features and advantages of the invention will be apparent from the following, more particular description of a preferred embodiment of the invention, as illustrated in the accompanying drawings, in which:

FIG. 4E depicts a graph of an exemplary signal at a node at the gate of a PFET and a drain source region of an isolation PFET in an example simulation of an example embodiment of the latch of the present invention;

FIG. 4F depicts a graph of an exemplary signal at a node at the gate of an NFET and a drain-source region of an isolation NFET in an example simulation of an example embodiment of the latch of the present invention;

FIG. 4G depicts a graph of an exemplary signal at a node at the gate of a PFET and a drain-source region of an isolation PFET in an example simulation of an example embodiment of the latch of the present invention; and FIG. 4H depicts a graph of an exemplary signal at a node at the gate of a pass NFET and a drain-source region of an isolation NFET in an example simulation of an example embodiment of the latch of the present invention.

Detailed Description of a Preferred Embodiment of the Invention

The preferred embodiment of the invention is discussed in detail below. While specific implementations are discussed, it should be understood that this is done for illustration purposes only. A person skilled in the relevant art will recognize that other components and configurations can be used without parting from the spirit and scope of the invention.

The illustrative embodiments described herein can concern electrical circuitry which can use voltage levels to represent binary logic states—namely, a "high" logic level and a "low" logic level. Further, electronic signals used by the various embodiments of the present invention are generally considered active when they are high, however, an asterisk (*) following the signal name in this application can indicate that the signal is negative or inverse logic unless otherwise specified. Negative or inverse logic can be considered active when the signal is low.

The present invention is directed to an improved latch. The latch can also be used, e.g., in any of a register, a processor, a microprocessor, a digital signal processor, a memory cell, a memory, and an electronic circuit. This application illustratively describes the latch in its use as part of processor as a register. The latch of the present invention is especially well suited for systems related to clocked circuitry.

While FIG. 2 below is illustrated in terms of metal oxide semiconductor (MOS) devices, the same principles apply when using bipolar transistors. The latch of the present invention is described using CMOS type transistors. The latch can also be constructed, e.g., using only NMOS or only PMOS transistors, or using bipolar transistors. Using bipolar transistors, PFETs can be replaced with PNP type transistors, and NFETs can be replaced with NPN type transistors, and references to source regions can be used to refer to emitters and drains can be equated with a collector of the bipolar transistor.

Figure 1:
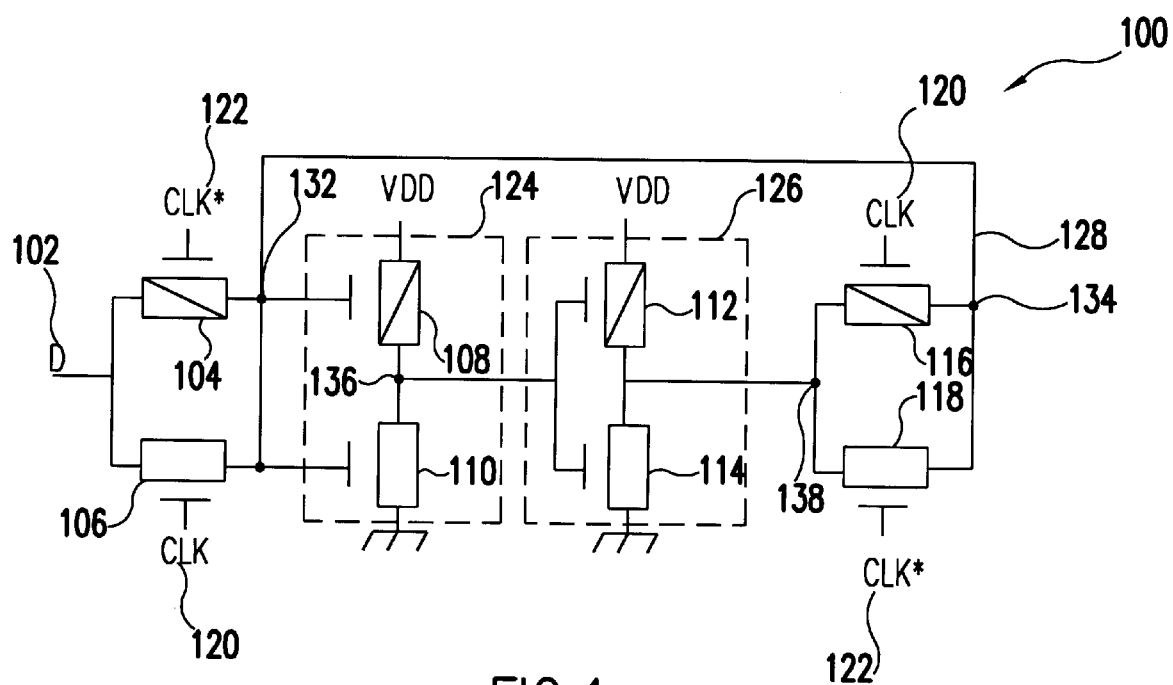
FIG. 1 is a schematic drawing of a convention unhardened CMOS register storage element.
Figure 2:
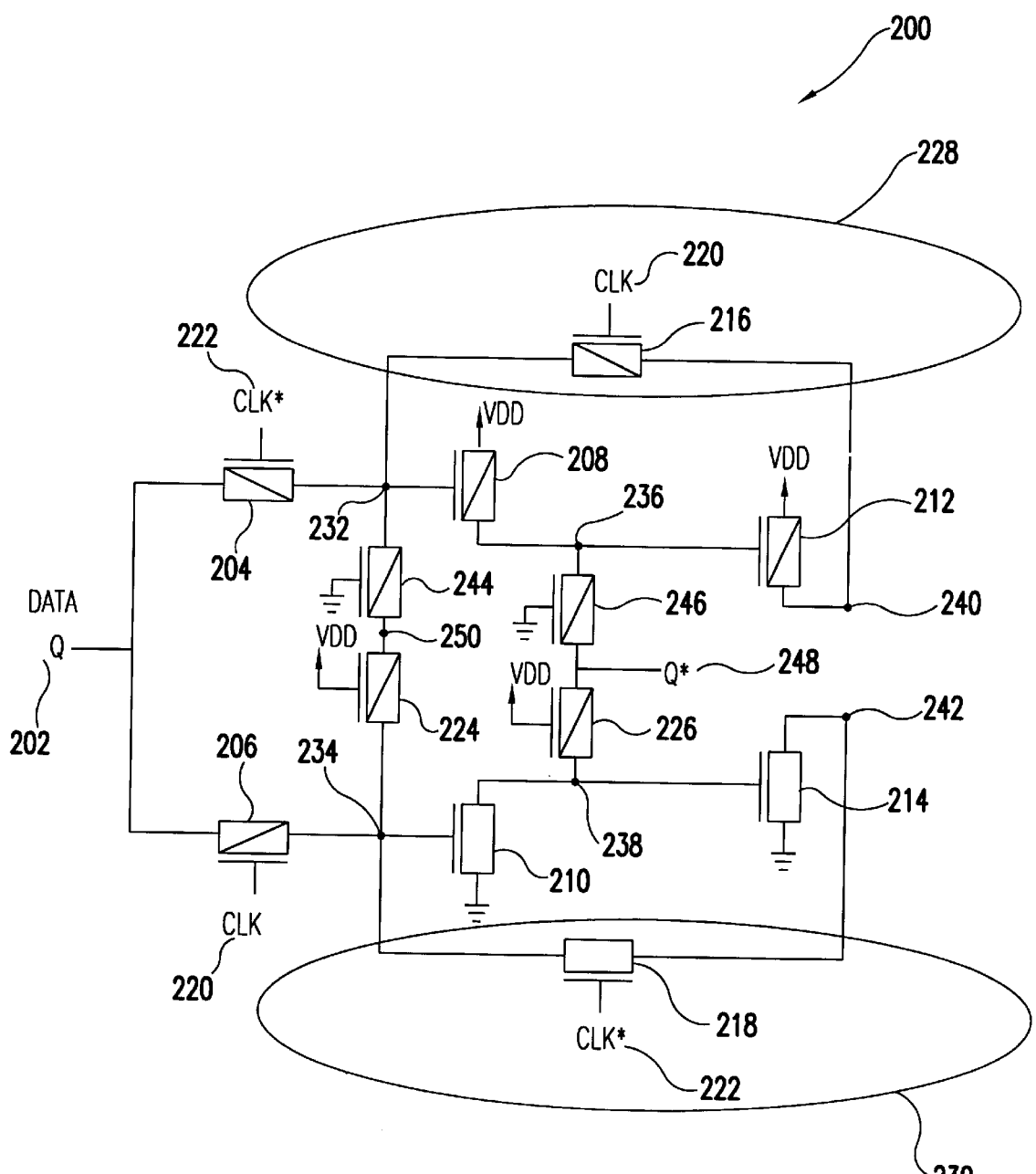
FIG. 2 is a schematic drawing of an exemplary embodiment of an enhanced SEU immune latch formed in accordance with the teaching of this invention.

Referring now to FIG. 2, an example embodiment of a hardened CMOS register latch 200 is depicted according to the present invention. Latch 200 of FIG. 2 can include a data input 202, also marked as Q, coupled to a CMOS transistor including a source-drain region of a PFET 204 and a source-drain region of an NFET 206. It will be apparent to those skilled in the art that references to a PFET are synonymous with references to a PMOS transistor and references to an NFET are synonymous with references to an NMOS transistor. The gate of PFET 204 is coupled to CLK* 222 and the gate of NFET 206 is coupled to CLK 220. PFET 204 can be coupled at a source-drain region to a node 232 and a gate of a PFET 208. NFET 206 can be coupled at a source-drain region to a node 234 and a gate of an NFET 210. A source-drain region of PFET 208 can be coupled to VDD and another source-drain region can be coupled to node 236 and a gate of a PFET 212. A source-drain region of NFET 210 can be coupled to ground and another source-drain region can be coupled to a node 238 and to a gate of an NFET 214. A source-drain region of PFET 212 can be coupled to VDD and another source-drain region of PFET 212 can be coupled to a node 240 and to a source-drain region of a feedback PFET 216 pass transistor. A source-drain region of NFET 214 can be coupled to ground and another source-drain region of NFET 214 can be coupled to a node 242 and to a source-drain region of a feedback NFET 218 pass transistor. Feedback 228 can include the feedback PFET 216 pass transistor having a gate coupled to CLK 220 and a source-drain region coupled to node 232. Feedback 230 can include the feedback NFET 218 pass transistor having a gate coupled to CLK* 222 and a source-drain region coupled to node 234.

Isolation transistors PFET 244 and PFET 246 can also be included in latch 200. Isolation transistor 244 can have a source-drain region coupled to node 232 and another source-drain region coupled to a node 250 and to a source-drain region of an NFET 224, and a gate coupled to ground. Isolation transistor 246 can have a source-drain region coupled to node 236 and another source-drain region coupled to a node 248 and to a source-drain region of an NFET 226, and a gate coupled to low potential, e.g., ground. NFET 224 can have a source-drain region coupled to node 234 and a gate coupled to high potential, e.g., $V_{DD}$, and NFET 226 can have a source-drain region coupled to node 238 and a gate coupled to high potential, e.g., $V_{DD}$. Node 248 can be treated as an output, also referred to as Q*, which can be a complement of input 202. It should be noted, that temporal isolation of the effects of a particle strike is provided by isolation transistors 244, 224 and 246, 226. Specifically, PFET 246 and NFET 226 can provide isolation between PFET 208 and NFET 210 and PFET 244 and NFET 224 can provide isolation between PFET 212 and NFET 214. Signal paths free of the isolation transistors are provided between stages. Specifically, a signal path at node 236 couples a drain-source region of transistor 208 directly to the gate of transistor 212 and a signal path at node 238 couples a drain-source region of transistor 210 directly to the gate of transistor 214. Similarly, a feedback signal path 228, which includes PFET transistor 216, couples at node 240 a drain-source region of a transistor 212 to the gate of transistor 208 at note 232; and feedback signal path 230, which includes NFET transistor 218, couples at node 242 a drain-source region of transistor 214 to the gate of transistor 210 at node 234. Thus, it will be appreciated that the isolation transistors 244, 224 and 246, 226 have a minimal effect to the write setup time of the register; i.e., the time that is required to write the data Q 202 into the register.

To illustrate the immunity to SEU particle strikes provided by the isolation transistors 244, 224 and 246, 226, consider a situation where data 202 is stored in the register latch 200 represented as a signal of $V_{DD}$ potential at the logically equivalent nodes 232 and 234. The opposite logic state is represented as $V_T$ and ground potential at the logically equivalent nodes 236 and 238, respectively. After data has been written into the register 200, node 232, 234, 240 and 242 are at the same logic 1 state, represented by potential level $V_{DD}$ or $V_{DD} -V_T$. Node 234 and 242 are at a voltage potential of $V_{DD}-V_T$. Nodes 232 and 240 are at $V_{DD}$. A potential SEU producing charged particle strike in this state can occur in P or N diffusions, respectively, associated with PFETs 204 and 208, and NFETs 206 and 210. The N diffusion associated with transistor 210 will in this state be at ground potential and is not susceptible to a strike.

The voltage operating range for nodes 232, 236 and 240 is $V_T$ to $V_{DD}$. The voltage operating range for nodes 234, 238 and 242 is GND to $V_{DD} -V_T$. Finally, the voltage range for output Q* 248 is GND to $V_{DD}$.

As an example illustration, a particle strike at node 234 as shown by the asterisk (*) depicted in graph 412 of FIG. 4F and the impact of the strike on node 232 as depicted in graph 410 of FIG. 4E, will now be described. An energizing ion strike affecting node 234 can cause a sharp drop in the potential of node 234 as a result of the strike. Due to the isolation transistors 244 and 224, acting like a relay or a resistor, slowing down the charge as it propagates toward node 232, advantageously node 232 is pulled down only by a small amount before the potential at node 232 is restored by output of PFET 212. Using the latch of the present invention, the output of PFET 212, the current supply from node 240, and PFET 216 over feedback 228, can sufficiently suppress a state change at node 232 and 234, protecting the nodes from upset. Thus, the register 200 does not upset or lose data as shown at node 248 of graph 406 in FIG. 4C.

It would be apparent to those skilled in the art that this is an illustrative example and the illustration assumes that one is writing a logic one, $V_{DD}$ into latch 200. Similarly, if one writes a logic zero to the latch 200, the latch will also not upset. The reader is referred to the simulations depicted in graphs 402–416 illustrated below in FIGS. 4A–4H, respectively, for further illustrations of SEU immunity to particle strikes at various nodes 232, 234, 236, 238, 248 and 250. The particle strikes are depicted numerically in graphs 406 and 408 and by asterisks (*) in graphs 410–416.

Similarly, isolation transistors 244 and 224 prevent an energizing ion strike affecting node 232 from causing the register 200 to upset or lose data.

The output of the register latch 200 depicted in FIG. 2 is node 248. Node 248, also known as Q*, is a complement to the data input 202, also known as Q.

Similarly, isolation transistors 246 and 226 can protect against an upset from a charged particle strike at nodes 236 and 238.

Figure 3:
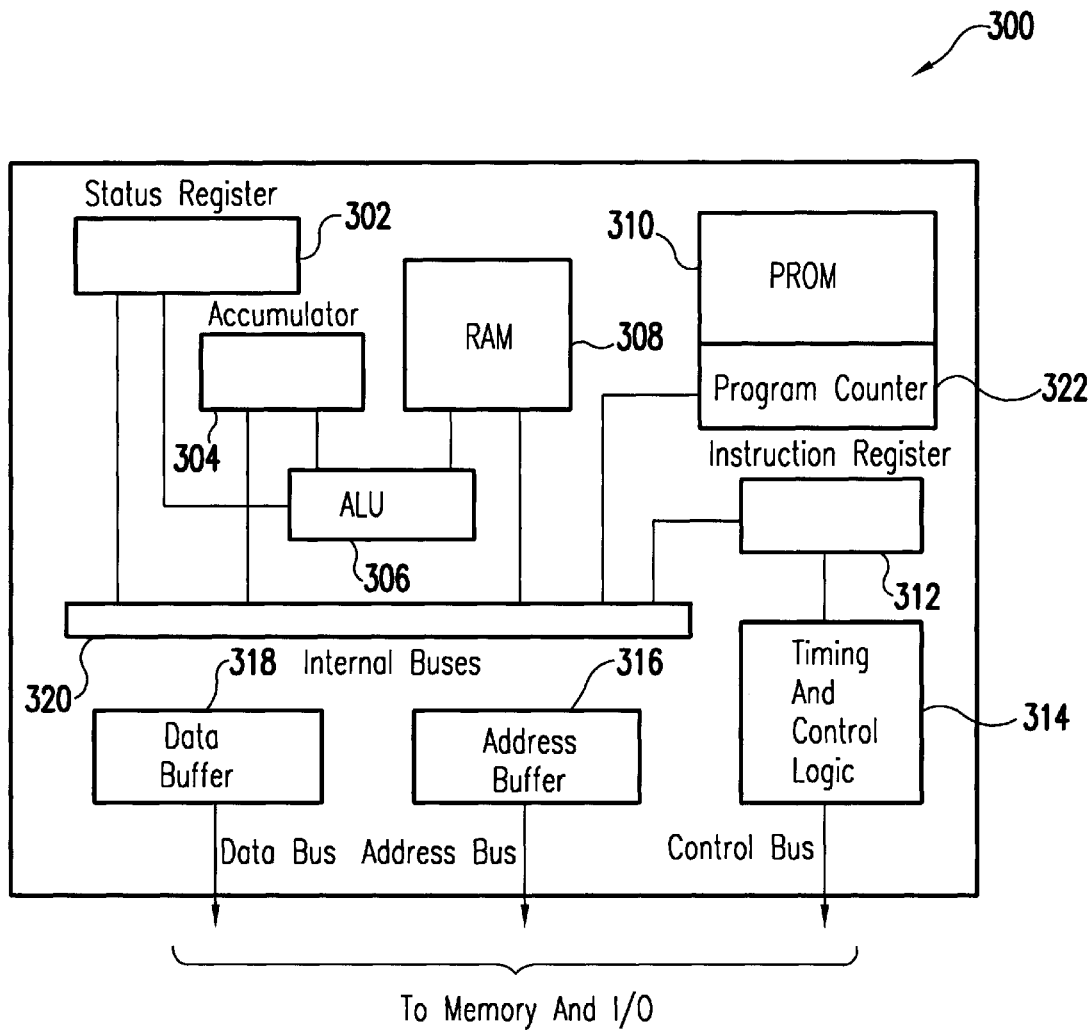
FIG. 3 is an example embodiment of a microprocessor including the SEU immune latch of the present invention.

FIG. 3 illustratively depicts a microprocessor 300 which can include the enhanced latch 200 of the present invention. It will be appreciated by those skilled in the art that the latch of the present invention can be used in registers of the microprocessor 300. In one embodiment of the invention, the latch can be used to build portions of microprocessor 300 such as, e.g., a status register 302, an instruction register 312, an arithmetic logic unit (ALU) 306 and other components, such as, e.g., memory cells and memories, such as random access memory (RAM) 308 and programmable read only memory (PROM) 310, data buffer 318 and address buffer 316. Microprocessor 300 is shown with other components such as, e.g., internal buses 320, accumulator 304, timing and control logic 314 and program counter 322, which can also include the latch of the present invention.

Similarly, in another embodiment of the invention, the latch 200 can be used as part of a digital signal processor (DSP).

In another embodiment of the invention, the latch 200 can be used as part of a clocked logic circuit, such as, e.g., those used in testing integrated circuits.

In another embodiment, the latch can be used as part of a memory cell, which in turn can be part of an array of memory cells known as a memory, and which the memory itself can be part of an electronic system including the memory.

The inventive latch 200 eliminates a write performance penalty of using polysilicon resistive hardened cells and since it uses transistors, the circuit tracks electrical characteristics of the FETs. The latch can be slower at high temperatures and faster at cold temperatures. The SEU hardness also tracks as a ratio of device geometries with any fabrication process variations. High density can be achieved because p-channel devices do not have to be large for charge recovery. The inventive latch permits the use of conventional thin film polysilicon devices with commercial static random access memory (SRAM) cells.

Figure 4A:
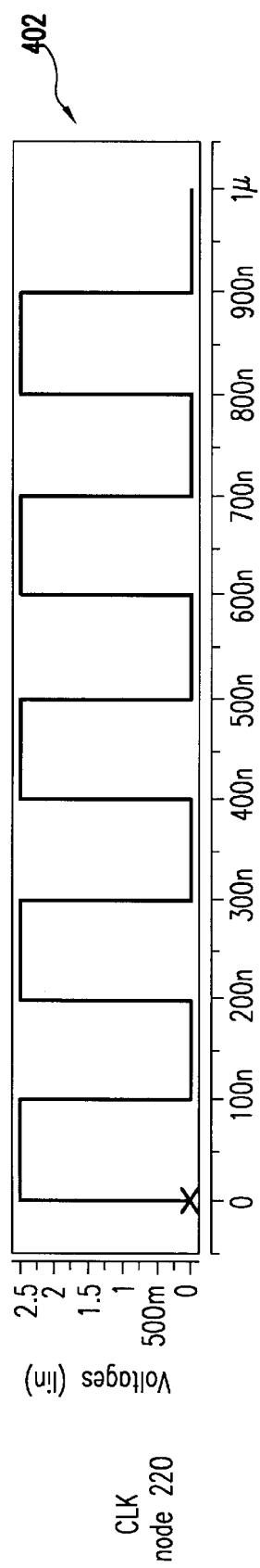
FIG. 4A depicts a graph of an exemplary clock signal in an example simulation of an example embodiment of the latch of the present invention.

FIG. 4A depicts a graph 402 of an exemplary clock signal at node 220 in an example simulation of an example embodiment of the latch 200 of the present invention.

Figure 4B:
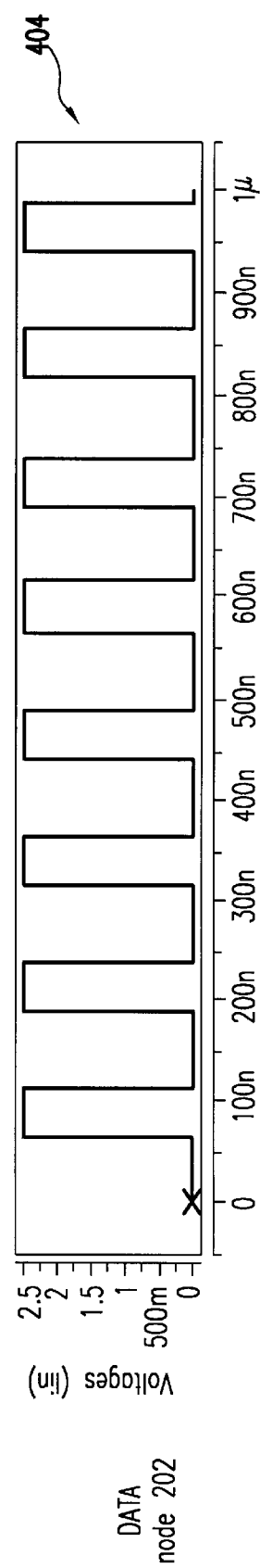
FIG. 4B depicts a graph of an exemplary data signal at an input node in an example simulation of an example embodiment of the latch of the present invention.

FIG. 4B depicts a graph 404 of an exemplary data signal inputted at input node Q 202 in an example simulation of an example embodiment of the latch 200 of the present invention.

Figure 4C:
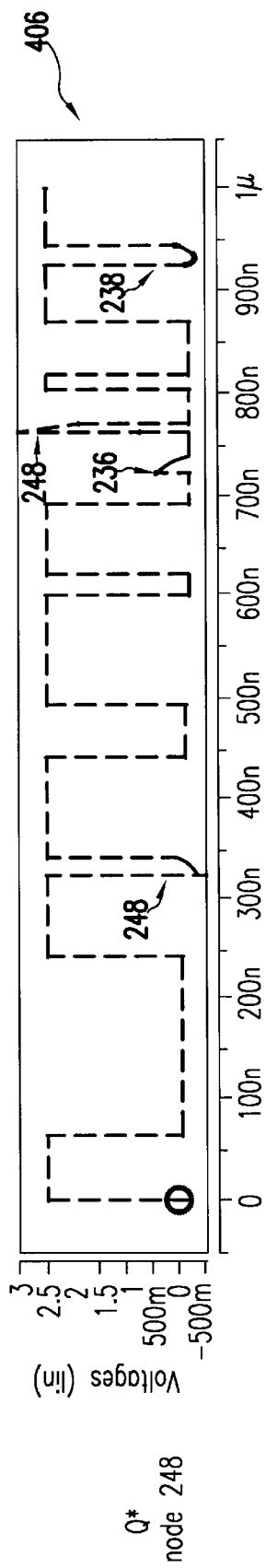
FIG. 4C depicts a graph of an exemplary output signal at a node in an example simulation of an example embodiment of the latch of the present invention.

FIG. 4C depicts a graph 406 of an exemplary output signal at output node Q* 248 observed in an example simulation of an example embodiment of the latch 200 of the present invention.

Figure 4D:
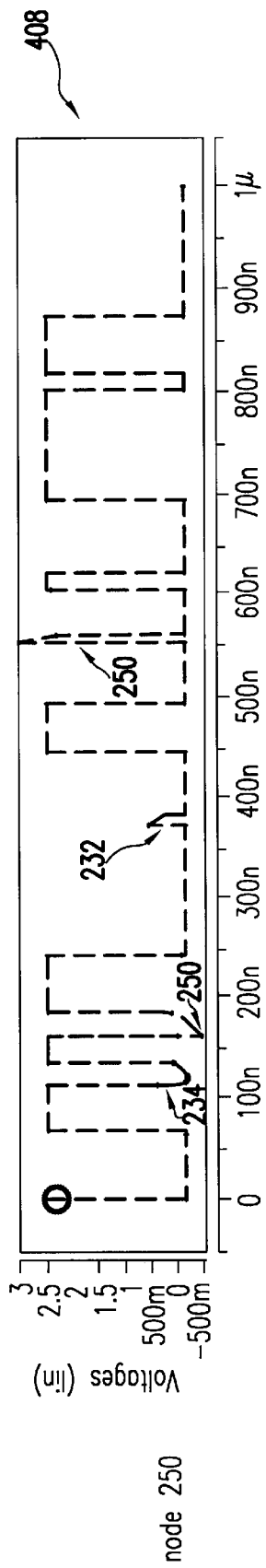
FIG. 4D depicts a graph of an exemplary signal at a node between an isolation PFET and NFET in an example simulation of an example embodiment of the latch of the present invention.

FIG. 4D depicts a graph 408 of an exemplary signal at a node 250 between isolation PFET 244 and isolation NFET 224 in an example simulation of an example embodiment of the latch 200 of the present invention.

FIG. 4E depicts a graph 410 of an exemplary signal at a node 232 at the gate of PFET 208 and a drain source region of PFET 244 in an example simulation of an example embodiment of the latch 200 of the present invention. An asterisk represents the location on graph 410 when node 232 is impacted by an ion strike.

FIG. 4F depicts a graph 412 of an exemplary signal at a node 234 at the gate of NFET 210 and a drain source region of NFET 224 in an example simulation of an example embodiment of the latch 200 of the present invention. An asterisk represents the location on graph 412 when node 234 is impacted by an ion strike. The maximum voltage potential is illustrated, in this embodiment as $V_{DD} -V_T$.

FIG. 4G depicts a graph 414 of an exemplary signal at a node 236 at the gate of PFET 212 and a drain-source region of PFET 246 in an example simulation of an example embodiment of the latch 200 of the present invention. An asterisk represents the location on graph 414 when node 236 is impacted by an ion strike.

FIG. 4H depicts a graph 416 of an exemplary signal at a node 238 at the gate of NFET 214 and a drain-source region of NFET 226 in an example simulation of an example embodiment of the latch 200 of the present invention. An asterisk represents the location on graph 416 when node 238 is impacted by an ion strike. The maximum voltage potential is illustrated, in this embodiment as $V_{DD} -V_T$.

Graph 406 of FIG. 4C illustrates an example simulation including injected particle strikes, chronologically, shown including a strike injected at node 248 (at approximately 320 ns, a particle strike tries to discharge node 248), effects on nodes 248 by a strike at node 236 (see also graph 414 of FIG.

4G), a strike injected at node 248 (at approximately 760 ns, a particle strike tries to charge node 248), and effects on node 248 by a strike at node 238 (see also graph 416 of FIG. 4H). As shown in graph 408, the injected particle strikes at node 248 do not cause a logic state change at node 250 due to the immunity provided by latch 200.

Graph 408 of FIG. 4D illustrates an example simulation including injected particle strikes, chronologically, shown including effects on node 250 by a strike injected at node 234 (see also graph 412 of FIG. 4F), a strike injected at node 250 (at approximately 160 ns, a particle strike tries to discharge node 250), effects on node 250 by a strike injected at node 232 (see also graph 410 of FIG. 4E), and a strike injected at node 250 (at approximately 550 ns, a particle strike tries to charge node 250). As shown in graph 406, the injected particle strikes do not cause a logic state change at node 248 due to the immunity provided by latch 200.

It would be apparent to those skilled in the art that other particle strikes could be sustained and latch 200 of the present invention would not be upset.

While the invention has been described in terms of a single preferred embodiment, those skilled in the art will recognize that the invention can be practiced with modification within the spirit and scope of the appended claims.

Having thus described the present invention and its preferred embodiments in detail, it will be readily apparent to those skilled in the relevant art that further modifications to the invention may be made without departing from the spirit and scope of the invention as presently claimed.

What is claimed is:

1. An enhanced single event immune latch comprising:
    a first PMOS transistor and a first NMOS transistor coupled together at a first drain-source region of said first PMOS transistor and a first drain-source region of said first NMOS transistor;
    a first PMOS isolation transistor and a first NMOS isolation transistor coupled together at first source-drain regions of said first PMOS isolation transistor and said first NMOS isolation transistor, and coupled at a second drain-source region of said first PMOS isolation transistor to a second drain-source region of said first PMOS transistor and at a second drain-source region of said first NMOS isolation transistor to a second drain-source region of said first NMOS transistor, wherein a gate of said first PMOS isolation transistor is coupled to low voltage and a gate of said first NMOS isolation transistor is coupled to high voltage;
    a second PMOS transistor coupled at a gate to said second drain-source region of said first PMOS and to said second drain-source region of said first isolation PMOS, wherein said second PMOS transistor is coupled at a first drain-source region to $V_{DD}$;
    a second NMOS transistor coupled at a gate to said second drain-source region of said first NMOS and to said second drain-source region of said first isolation NMOS, wherein said second NMOS transistor is coupled at a first drain-source region to GND;
    a second PMOS isolation transistor and a second NMOS isolation transistor coupled together at first source-drain regions of said second PMOS isolation transistor and said second NMOS isolation transistor, and coupled at a second drain-source region of said second PMOS isolation transistor to a second drain-source region of said second PMOS transistor and at a second drain-source-region of said second NMOS isolation transistor to a second drain-source region of said second NMOS transistor, wherein a gate of said second PMOS isolation transistor is coupled to low voltage and a gate of said second NMOS isolation transistor is coupled to high voltage;
    a feedback PMOS transistor coupled at a first drain-source region to said second drain-source region of said first PMOS transistor;
    a feedback NMOS transistor coupled at a first drain-source region to said second drain-source region of said first NMOS transistor;
    a third PMOS transistor coupled at a first drain-source region to a second drain-source region of said feedback PMOS transistor, and at a gate to said second drain-source region of said second PMOS isolation transistor, and at a second drain-source region to $V_{DD}$;
    a third NMOS transistor coupled at a first drain-source region to a second drain-source region of said feedback NMOS transistor, and at a gate to said second drain-source region of said second NMOS isolation transistor, and at a second drain-source region to GND;
    a data input that is coupled to said first drain-source region of said first PMOS transistor and said first drain-source region of said first NMOS transistor;
    a clock coupled to a gate of said first NMOS transistor and a gate of said feedback PMOS transistor; and
    a complementary clock of said clock coupled to a gate of said first PMOS transistor and a gate of said feedback NMOS transistor.

2. The single event upset immune latch according to claim 1, wherein said first PMOS isolation transistor limits a change in potential at a node between said second drain-source region of said first PMOS transistor and said second drain-source region of said first PMOS isolation transistor, and wherein said first NMOS isolation transistor limits a change in potential at a node between said second drain-source region of said first NMOS transistor and said second drain-source region of said first NMOS isolation transistor, due to a charged particle strike causing a change of potential in a corresponding node at said second drain-source region of said first NMOS transistor and at said second drain-source region of said first PMOS transistor, respectively.

3. The single event upset immune latch according to claim 1, wherein said second PMOS isolation transistor limits a change in potential at a node between said second drain-source region of said second PMOS transistor and said gate of said third PMOS transistor, and said second NMOS isolation transistor limits a change in potential at a node between said second drain-source region of said second NMOS transistor and said gate of said third NMOS transistor, due to a charged particle strike causing a change of potential in a corresponding node at said gate of said third NMOS transistor, and at said gate of said third PMOS transistor, respectively.

4. The single event upset immune latch according to claim 1, wherein said low voltage is ground potential.

5. The single event upset immune latch according to claim 1, wherein said high voltage is $V_{DD}$ potential.

6. A method for providing immunity using isolation transistors in an enhanced single event offset bi-stable circuit comprising the steps of:
    storing data in a register at a drain-source region of a first PMOS isolation transistor and at a drain-source region of a first NMOS isolation transistor, wherein said drain-source regions are logically equivalent;
    placing a drain-source region of a second PMOS isolation transistor and a drain-source region of a second NMOS isolation transistor in a logic state opposite that of said drain-source regions of said first PMOS isolation and said first NMOS isolation transistors, wherein said drain-source regions of said second PMOS isolation transistor and said second NMOS isolation transistors are also logically equivalent;

writing the data into said register including setting a drain-source region of a PMOS feedback transistor at the same potential as said drain-source regions of said first PMOS isolation and said first NMOS isolation transistors;

setting a drain-source region of an NMOS feedback transistor at a potential equal to the potential at the drain source region of the first NMOS isolation transistor; and avoiding upset or loss of data in said register during a single event upset (SEU) producing an energizing ion strike to said drain-source region of said first NMOS isolation transistor causing a sharp drop in potential of said drain-source region of said first NMOS isolation transistor, including using said first PMOS isolation transistor and said first NMOS isolation transistor to permit potential at said drain-source region of said first PMOS isolation transistor to be pulled down by only a small amount before the potential at said drain-source region of said first NMOS isolation transistor is restored.

7. The method according to claim 6, wherein said data in said register is represented as a signal of low voltage or high voltage potential.

8. The method according to claim 7, wherein said low voltage is a signal of ground potential.

9. The method according to claim 7, wherein said high voltage is a signal of $V_{DD}$ potential.

10. A latch comprising:

first, second, and third p-type transistors, each having an input and output;

first, second, and third n-type transistors each having an input and output;

a first p-type isolation device and a first n-type isolation device coupled between the outputs of the first p-type and first n-type transistors;

a first feedback transistor coupling the output of the third p-type transistor to the input of the second p-type transistor;

a second feedback transistor coupling the output of the third n-type transistor to the input of the second n-type transistor; and a second p-type isolation device and a second n-type isolation device coupled between the outputs of the second p-type and second n-type transistors.

11. The latch according to claim 10, wherein said first p-type isolation device and said second p-type isolation device have gates tied to a low voltage potential.

12. The latch according to claim 11, wherein said low voltage is a signal of ground potential.

13. The latch according to claim 10, wherein said first n-type isolation device and said second n-type isolation device have gates tied to a high voltage potential.

14. The latch according to claim 13, wherein said high voltage is a signal of $V_{DD}$ potential.

15. A digital signal processor (DSP) comprising:

a latch comprising, first, second, and third p-type transistors, each having an input and output;

first, second, and third n-type transistors each having an input and output;

a first p-type isolation device and a first n-type isolation device coupled between the outputs of the first p-type and first n-type transistors;

a first feedback transistor coupling the output of the third p-type transistor to the input of the second p-type transistor;

a second feedback transistor coupling the output of the third n-type transistor to the input of the second n-type transistor; and a second p-type isolation device and a second n-type isolation device coupled between the outputs of the second p-type and second n-type transistors.

16. The DSP according to claim 15, wherein said first p-type isolation device and said second p-type isolation device have gates tied to a low voltage potential.

17. The DSP according to claim 16, wherein said low voltage is a signal of ground potential.

18. The DSP according to claim 15, wherein said first n-type isolation device and said second n-type isolation device have gates tied to a high voltage potential.

19. The DSP according to claim 18, wherein said high voltage is a signal of $V_{DD}$ potential.

20. A microprocessor comprising a register, said register comprising:

first, second, and third p-type transistors, each having an input and output;

first, second, and third n-type transistors each having an input and output;

a first p-type isolation device and a first n-type isolation device coupled between the outputs of the first p-type and first n-type transistors;

a first feedback transistor coupling the output of the third p-type transistor to the input of the second p-type transistor;

a second feedback transistor coupling the output of the third n-type transistor to the input of the second n-type transistor; and a second p-type isolation device and a second n-type isolation device coupled between the outputs of the second p-type and second n-type transistors.

21. A method of operating a radiation hardened storage cell latch circuit comprising:

suppressing a logic state change of the storage cell latch circuit that has a source-drain region coupled p-type isolation and n-type isolation transistors and p-type feedback and n-type feedback transistors in response to a particle hit on a circuit node of the latch circuit;

recovering from a critical charge deposited on the circuit as a result of said particle hit on said circuit node; and isolating said node circuit by increasing source/drain impedance RC delay of transistors, thereby slowing feedback propagation through and allowing more time for recovery from the suppressing a state change step.

22. The method of claim 21, including at least one of the following:

increasing the immunity of the struck node by slowing charge propagation by supplying feedback current;

limiting the amount of voltage drop using a feedback transistor to allow current to flow over a feedback path to avoid upset.

* * * * *